United States Patent
Olofsson

(10) Patent No.: US 6,664,481 B1
(45) Date of Patent: Dec. 16, 2003

(54) ARRANGEMENT FOR ENABLING TRIMMING ON A SUBSTRATE AND A METHOD OF PRODUCING A SUBSTRATE THAT ENABLES TRIMMING

(75) Inventor: Lars-Anders Olofsson, Järfälla (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/526,534

(22) Filed: Mar. 16, 2000

(30) Foreign Application Priority Data

Mar. 17, 1999 (SE) .............................................. 9900960

(51) Int. Cl.[7] ................................................. H05K 1/16
(52) U.S. Cl. ........................ 174/260; 29/836; 29/832; 29/847; 361/761
(58) Field of Search ................................ 174/260, 261; 361/719, 720, 734, 760–766; 29/832, 836, 847

(56) References Cited

U.S. PATENT DOCUMENTS

| | | | | |
|---|---|---|---|---|
| 3,875,479 A | * | 4/1975 | Jaggar | 174/68.5 |
| 4,470,096 A | | 9/1984 | Guertin | |
| 5,488,540 A | * | 1/1996 | Hatta | 361/794 |
| 5,629,838 A | * | 5/1997 | Knight et al. | 361/782 |
| 5,726,612 A | * | 3/1998 | Mandai et al. | 333/184 |
| 5,952,901 A | | 9/1999 | Nakano | |
| 6,134,117 A | * | 10/2000 | Funk et al. | 361/760 |
| 6,208,525 B1 | * | 3/2001 | Imasu et al. | 361/783 |
| 6,252,177 B1 | * | 6/2001 | Stoddard | 174/260 |

FOREIGN PATENT DOCUMENTS

| | | |
|---|---|---|
| GB | 2 133 933 A | 8/1984 |
| JP | 60-194556 | 10/1985 |
| JP | 2-52494 | 2/1990 |
| WO | WO 99/00960 | 1/1999 |

* cited by examiner

Primary Examiner—Kamand Cuneo
Assistant Examiner—Jeremy Norris
(74) Attorney, Agent, or Firm—Burns, Doane, Swecker & Mathis, L.L.P.

(57) ABSTRACT

A method and apparatus for trimming a discrete surface-mounted component or a component integrated in a substrate including providing a trimmable structure mounted on the surface of a substrate for each component to be trimmed. In an exemplary embodiment, the component to be trimmed is a capacitor. In another exemplary embodiment, the trimmable structure is one electrode of a trimmable capacitor whose other electrode is integrated in the substrate, and the trimmable capacitor is connected in parallel with a surface mounted capacitor to be trimmed.

12 Claims, 1 Drawing Sheet

US 6,664,481 B1

ARRANGEMENT FOR ENABLING TRIMMING ON A SUBSTRATE AND A METHOD OF PRODUCING A SUBSTRATE THAT ENABLES TRIMMING

TECHNICAL FIELD

The invention relates generally to trimming and more specifically to functional trimming and/or component trimming on a substrate having components that are surface-mounted on the substrate and/or integrated in the substrate.

BACKGROUND OF THE INVENTION

Laser trimming of printed circuit patterns on the surface of a ceramic substrate is known per se.

In some applications, there are strict requirements on the physical dimensions of the substrate. This has led to a design of so called LTCC substrates (Low Temperature Cofired Ceramic substrates) where some components such as resistors, inductors and capacitors are integrated on different layers of the substrate at the same time as there are surface-mounted components mounted on the surface of the substrate.

From JP Patent Abstracts Nos. JP 02052494 A and JP 60194556 A, it is known to make a hole or a window in multilayer substrates in order to trim a component integrated on a layer in the substrate. The problem with making a hole or a window in the top layer is that too large an area is lost on the top layer where the surface space is very restricted.

SUMMARY OF THE INVENTION

The object of the invention is to enable trimming on a multilayer substrate where there are very strict requirements on the physical dimensions of the substrate and especially the top surface, without having to make holes or windows in the substrate in order to free part of the component to be trimmed.

This is attained in accordance with the invention in that a trimmable structure connected to the component to be trimmed, irrespective of whether the component is surface-mounted or integrated in the substrate, is provided on the surface of the substrate for each component to be trimmed.

Both functional trimming and component trimming can be accomplished in this way.

BRIEF DESCRIPTION OF THE DRAWING

The invention will be described more in detail below with reference to the appended drawing on which FIG. 1 schematically illustrates a multilayer substrate with a surface-mounted inductor and a first embodiment of a trimming structure in accordance with the invention, FIG. 2 schematically illustrates a multilayer substrate with a surface-mounted capacitor and a second embodiment of a trimming structure in accordance with the invention, FIG. 3 schematically illustrates a multilayer substrate with a surface-mounted chip resistor and a third embodiment of a trimming structure in accordance with the invention, and FIG. 4 schematically illustrates a multilayer substrate with a surface-mounted discrete component, a resistor integrated in the substrate, and a fourth embodiment of a trimming structure in accordance with the invention.

DESCRIPTION OF THE INVENTION

Figure 1:
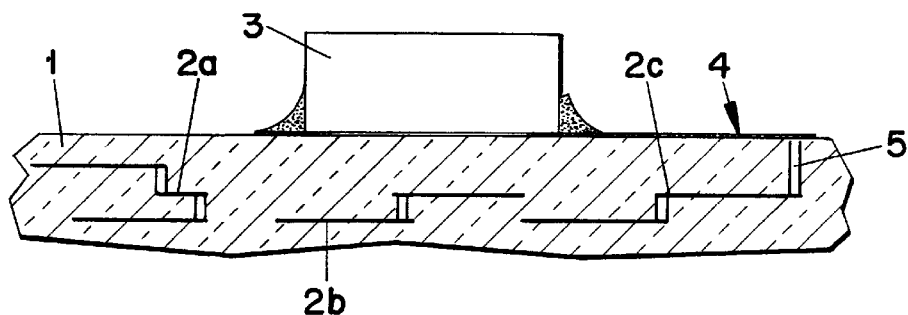

FIG. 1 schematically illustrates a multilayer substrate 1 in which a number of components 2a, 2b, 2c are integrated on different layers.

On the surface of the substrate 1, a discrete component in the form of an inductor 3 is mounted.

In applications where the inductances of the inductors are of so low values that it is possible to implement the component as printed conductors in the ceramic substrate, most of the conductor pattern is on an inner layer where it does not affect the surface area of the substrate. To enable trimming of the inductance value, only a minimal portion of the inductor is located on the surface of the substrate in accordance with the invention.

In applications where higher inductance values are required, surface-mounted inductors have to be used such as the inductor 3 schematically illustrated in FIG. 1.

In accordance with the invention, the discrete inductor 3 is series-connected with a trimmable structure 4 printed on the surface of the substrate 1. In the embodiment in FIG. 1, the trimmable structure 4 comprises a conductor that is to be laser trimmed if necessary.

Since the inductance values of commercially available discrete inductors are fixed, the trimmable structure 4 is selected in such a manner that is enables trimming of the difference between the commercially available fixed inductance values and the area of the trimmable structure on the top layer is designed so it minimizes the occupied area.

The trimming structure 4 in FIG. 1 can of course be used to laser trim also inductors integrated in the substrate 1.

Thus, e.g. the component 2c in the substrate 1 in FIG. 1 can be an inductor integrated on a layer in the substrate 1. To enable trimming of the inductance value of the inductor 2c by means of the trimming structure 4, the inductors 2c and 4 are interconnected through a via hole 5 in the top layer of the substrate 1.

Figure 2:
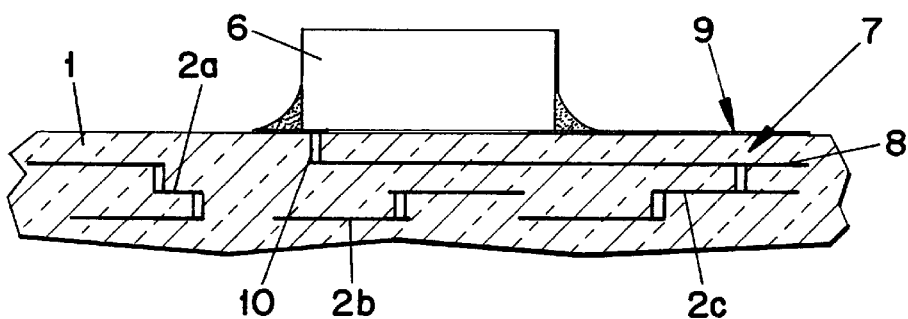

FIG. 2 illustrates an embodiment of the substrate 1 in FIG. 1 with the components 2a, 2b and 2c.

In the embodiment in FIG. 2, a discrete capacitor 6 is surface-mounted on the surface of the substrate 1. The capacitor 6 is supposed to be parallel-connected with a trimmable capacitor 7 having one electrode 8 integrated on a layer in the substrate 1 and its other electrode in the form of a trimming electrode 9 on the surface of the substrate 1. The trimming electrode 9 is connected in series with one of the electrodes of the surface-mounted discrete capacitor 6.

By means of a trimming structure 9 which is in the form of a conductive area, it will be possible to laser trim the capacitances of the capacitors 6 and 7.

The electrode 8 of the capacitor 7, integrated on a layer in the substrate 1, is connected to the other electrode of the discrete capacitor 6 through a via hole 10 in the top layer of the substrate 1.

Figure 3:
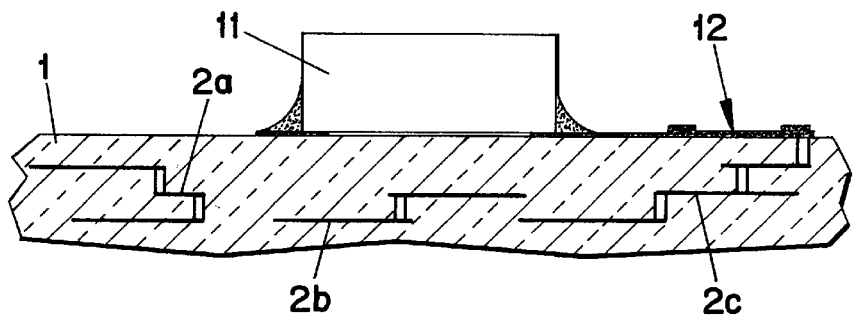

FIG. 3 illustrates another embodiment of the substrate 1 with integrated components 2a, 2b and 2c.

In the embodiment in FIG. 3, it is supposed that a discrete chip resistor 11 is mounted on the surface of the substrate 1.

To enable trimming of the discrete resistor 11, a trimmable structure in the form of a trimmable resistor 12 is printed on the surface of the substrate 1 and series-connected with the discrete resistor 11. As indicated in FIG. 3, the trimmable resistor 12 is connected to other components integrated in the substrate 1 on different layers.

The trimmable resistor 12 is trimmed by means of conventional laser trimming.

Figure 4:
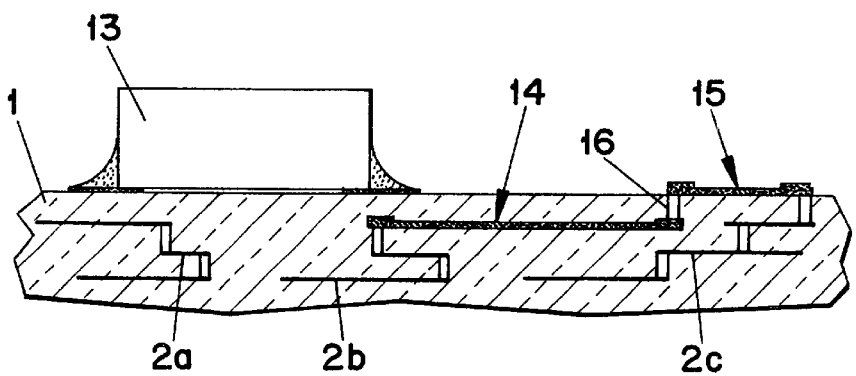

FIG. 4 illustrates a further embodiment of the substrate 1 with integrated components 2a, 2b and 2c.

In the embodiment in FIG. 4, a discrete component 13 is mounted on the surface of the substrate 1. A resistor 14 has been printed on an inner layer of the substrate 1. To enable trimming of the resistor 14, a trimmable resistor 15 is printed on the surface of the substrate 1 and connected in series with the resistor 14 through a via hole 16 in the top layer of the substrate 1. To trim the resistance value of the resistor 14, laser trimming is used to trim the trimmable resistor 15.

It should be obvious from the above, that trimming is easily facilitated using trimmable component structures as described above.

What is claimed is:

1. An arrangement for enabling trimming of at least one of discrete components that are surface-mounted on a substrate and components that are integrated in the substrate, comprising the substrate and a trimmable structure on the surface of the substrate for each component to be trimmed, wherein trimming the trimmable structure trims the at least one discrete component.

2. The arrangement as claimed in claim 1, the component being a capacitor integrated in the substrate, wherein the trimmable structure is connected to one of the electrodes of the capacitor integrated in the substrate, and forms a trimmable capacitor connected in parallel with the capacitor integrated in the substrate.

3. The arrangement as claimed in claim 1, the component being a surface-mounted capacitor, wherein the trimmable structure is one electrode of a trimmable capacitor whose other electrode is integrated in the substrate, said trimmable capacitor being connected in parallel with the surface-mounted capacitor.

4. The arrangement as claimed in claim 1, the component being an inductor that is surface-mounted on and/or integrated in the substrate, wherein the trimmable structure is a trimmable inductor connected in series with the, inductor that is surface-mounted on and/or integrated in the substrate.

5. The arrangement as claimed in claim 1, the component being a resistor that is surface-mounted on and/or integrated in the substrate, wherein the trimmable structure is a trimmable resistor that is series-connected or parallel-connected with the resistor that is surface-mounted on and/or integrated in the substrate.

6. A method of producing a substrate having at least one of discrete components that are surface-mounted on the substrate and components that are integrated in the substrate, comprising providing the substrate and providing a trimmable structure on the surface of the substrate for each component to be trimmed to enable trimming thereof, wherein trimming the trimmable structure trims the at least one discrete component.

7. The method as claimed in claim 6, the component being a capacitor surface-mounted on the substrate, comprising connecting one of the electrodes of the capacitor to the trimmable structure and the other electrode of the capacitor to an electrode integrated in the substrate, forming a trimmable capacitor together with the trimmable structure.

8. The method as claimed in claim 6, the component being a capacitor integrated in the substrate, comprising connecting one of the electrodes of the capacitor to the trimmable structure to form a trimmable capacitor that is connected in parallel with the capacitor integrated in the substrate.

9. The method as claimed in claim 6, the component being an inductor that is surface mounted on or integrated in the substrate, comprising connecting the trimmable structure in series with the inductor that is surface mounted on or integrated in the substrate.

10. The method as claimed in claim 6, the component being a resistor that is surface-mounted on or integrated in the substrate, comprising connecting the trimmable structure in series or in parallel with the resistor that is surface-mounted on and/or integrated in the substrate.

11. An arrangement for trimming a discrete capacitor that is surface-mounted on a substrate, the arrangement comprising:

a trimmable capacitor having:
      a trimmable first electrode on the surface of the substrate, and
      a second electrode integrated in the substrate,
   wherein the first and second electrodes of the trimmable capacitor are connected to respective electrodes of the surface-mounted discrete capacitor to connect the trimmable capacitor in parallel with the surface-mounted discrete capacitor.

12. A method of producing a substrate that enables trimming of a discrete capacitor that is surface-mounted on the substrate, the method comprising:

providing a trimmable capacitor having a trimmable first electrode on the surface of the substrate and a second electrode integrated in the substrate; and
   connecting the first and second electrodes of the trimmable capacitor to respective electrodes of the surface-mounted discrete capacitor to connect the trimmable capacitor in parallel with the surface-mounted discrete capacitor.

* * * * *